(12) United States Patent
Miller

(10) Patent No.: US 10,529,889 B2
(45) Date of Patent: *Jan. 7, 2020

(54) FRONT-SIDE EMITTING MID-INFRARED LIGHT EMITTING DIODE

(71) Applicant: Terahertz Device Corporation, Salt Lake City, UT (US)

(72) Inventor: Mark S. Miller, Salt Lake City, UT (US)

(73) Assignee: Terahertz Device Corporation, Salt Lake City, UT (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/919,445

(22) Filed: Mar. 13, 2018

(65) Prior Publication Data
US 2018/0204975 A1   Jul. 19, 2018

Related U.S. Application Data

(63) Continuation of application No. 14/629,124, filed on Feb. 23, 2015, now Pat. No. 9,947,827.
(Continued)

(51) Int. Cl.
| | |
|---|---|
| *H01L 33/06* | (2010.01) |
| *H01L 33/00* | (2010.01) |
| *H01L 33/30* | (2010.01) |
| *H01L 33/38* | (2010.01) |
| *H01L 33/60* | (2010.01) |
| *H01L 33/62* | (2010.01) |
| *H01L 23/00* | (2006.01) |

(Continued)

(52) U.S. Cl.
CPC .............. *H01L 33/06* (2013.01); *H01L 24/05* (2013.01); *H01L 33/0025* (2013.01); *H01L 33/0062* (2013.01); *H01L 33/30* (2013.01); *H01L 33/38* (2013.01); *H01L 33/60* (2013.01); *H01L 33/62* (2013.01); *H01L 33/0079* (2013.01); *H01L 33/04* (2013.01); *H01L 33/40* (2013.01); *H01L 33/46* (2013.01); *H01L 2224/04042* (2013.01); *H01L 2224/487* (2013.01); *H01L 2224/48091* (2013.01); *H01L 2933/0016* (2013.01); *H01L 2933/0025* (2013.01)

(58) Field of Classification Search
None
See application file for complete search history.

(56) References Cited

U.S. PATENT DOCUMENTS

| | | | |
|---|---|---|---|
| 4,829,343 A | 5/1989 | Levi | |
| 6,404,791 B1 | 6/2002 | Yang | |

(Continued)

OTHER PUBLICATIONS

U.S. Appl. No. 61/942,932, filed Feb. 21, 2014, Miller.
(Continued)

*Primary Examiner* — Charles D Garber
*Assistant Examiner* — Steven M Christopher
(74) *Attorney, Agent, or Firm* — Ray Quinney & Nebeker P.C.; Paul N. Taylor

(57) ABSTRACT

A device emitting mid-infrared light that comprises a semiconductor substrate of GaSb or closely related material. The device can also comprise epitaxial heterostructures of InAs, GaAs, AlSb, and related alloys forming light emitting structures cascaded by tunnel junctions. Further, the device can comprise light emission from the front, epitaxial side of the substrate.

25 Claims, 8 Drawing Sheets

Related U.S. Application Data

(60) Provisional application No. 61/942,932, filed on Feb. 21, 2014.

(51) Int. Cl.
*H01L 33/46* (2010.01)
*H01L 33/04* (2010.01)
*H01L 33/40* (2010.01)

(56) References Cited

U.S. PATENT DOCUMENTS

| | | |
|---|---|---|
| 6,741,659 B1 | 5/2004 | Chan et al. |
| 8,811,442 B2 | 8/2014 | Schulz |
| 2005/0023550 A1 | 2/2005 | Eliashevich et al. |
| 2005/0087753 A1 | 4/2005 | D'Evelyn et al. |
| 2005/0253222 A1* | 11/2005 | Caneau ............... B82Y 20/00 257/607 |
| 2007/0034852 A1 | 2/2007 | Nelson |
| 2007/0059852 A1 | 3/2007 | Miyachi et al. |
| 2008/0073641 A1 | 3/2008 | Cheng et al. |
| 2008/0073658 A1* | 3/2008 | Wirth ............... H01L 33/145 257/96 |
| 2008/0074646 A1 | 3/2008 | Archibald |
| 2009/0127462 A1 | 5/2009 | Gunapala et al. |
| 2011/0095291 A1 | 4/2011 | Quitoriano |
| 2011/0215290 A1 | 9/2011 | Choi et al. |
| 2011/0316015 A1 | 12/2011 | Murphy et al. |
| 2012/0273043 A1 | 11/2012 | Lochtefeld et al. |
| 2012/0280261 A1 | 11/2012 | Tarsa et al. |
| 2013/0001615 A1 | 1/2013 | Kim |
| 2013/0328075 A1 | 12/2013 | Tajima et al. |
| 2014/0367731 A1* | 12/2014 | Youn ............... H01L 33/42 257/99 |
| 2015/0243839 A1 | 8/2015 | Miller |

OTHER PUBLICATIONS

U.S. Appl. No. 14/629,124, Aug. 13, 2015, Office Action.
U.S. Appl. No. 14/629,124, May 17, 2016, Office Action.
U.S. Appl. No. 14/629,124, Jan. 26, 2017, Office Action.
U.S. Appl. No. 14/629,124, Aug. 4, 2017, Office Action.
U.S. Appl. No. 14/629,124, Dec. 13, 2017, Notice of Allowance.

* cited by examiner

FRONT-SIDE EMITTING MID-INFRARED LIGHT EMITTING DIODE

CROSS-REFERENCE TO RELATED APPLICATIONS

This application is a continuation of U.S. patent application Ser. No. 14/629,124, entitled "Front-side Emitting Mid-Infrared Light Emitting Diode," filed on Feb. 23, 2015. U.S. patent application Ser. No. 14/629,124 claims priority to and the benefit of U.S. Provisional Application Ser. No. 61/942,932, entitled "Front-side Emitting Mid-Infrared Light Emitting Diode," filed on Feb. 21, 2014. The aforementioned applications are incorporated by reference in its entirety herein.

BACKGROUND OF THE INVENTION

1. Technical Field

The embodiments disclosed herein are related to the field of light emitting diode (LED) devices.

2. Background and Relevant Art

Unless otherwise indicated herein, the materials described in this section are not prior art to the claims in this application and are not admitted to be prior art by inclusion in this section. The use of the term "background" is inclusive of the term "context." Thus, the following section provides both context for the disclosure and may also provide patentable support for the claims.

The use of doped semiconductors to create barriers, injectors, tunnel junction contacts, cascade LED junction, and other related device has long been known in the art. Specially, conventional semiconductor materials can be comprised of doped semiconductor layers placed into contact with each other to create one or more p-n junctions. In the case of light emitting diodes (LEDs), as electrical current is applied to the junctions, electrons and holes combine with each other and emit photons. The energy contained in the emitted photos corresponds to the energy difference between the respective holes and electrons.

Conventional LED device dies have dimensions around one millimeter square and a tenth of a millimeter thick. The die substrates have thin semiconductor heterostructure layers on one side, with the layers patterned by lithography for making electrical contact. Forcing an electrical current through the heterostructure layers can convert electrical power to optical power. Light generated within the heterostructures can be extracted from a die with combinations of surface features and coatings, such that light can escape which would otherwise be mostly confined to the die because of total internal reflection.

High-brightness light emitting diode (LED) chips are also known. These chips can emit light with wavelengths that fall in the near-infrared, visible, or ultraviolet spectral ranges. High-brightness LEDs require several unique design considerations. For example, design considerations for High-brightness LEDs may also involve packaging, thermal management, electrical control, and optical guiding considerations.

In some conventional systems, the dies are mechanically attached, using eutectic bonds or conducting epoxy, to thermally conductive LED packages, which have been specifically developed to dissipate the waste heat from high-brightness LED die. The dies are typically electrically contacted with wire bonds to their surfaces. The electrical drive and control of current through high-brightness LEDs is typically accomplished using specialized integrated circuits developed for the power, voltage, and thermal regulation requirements of high-brightness LEDs.

Semiconductor heterostructures based upon antimonide-arsenide semiconductor materials have been researched and developed for their uses as mid-infrared light emission structures. The great design flexibility available from combinations of these materials has more generally led to interest and developments for transistors, optical detectors, and light emitters.

For mid-infrared light emission, the emission wavelength from a device can be set using bulk alloys, superlattices, or quantum wells. Antimonide-arsenide superlattices and quantum wells are of particular benefit because they can also be engineered to mitigate material loss mechanisms that are prominent difficulties at mid-infrared wavelengths, such as the loss mechanisms of free-carrier absorption and Auger recombination.

Another useful property available with some antimonide-arsenide layer combinations is the ability to form interband tunnel junctions, which allows for light emission stages to be cascaded. Several combinations of antimonide-arsenide layers can provide a double-heterostructure confinement configuration for confining charge carriers to the light emitting alloys, superlattices, or quantum wells.

LED device structures based upon antimonide-arsenide heterostructures have been researched and developed at a few mid-infrared emission wavelengths using various particular devices configurations for the particular wavelength. However, from about 3 to 20 µm, there are wavelength ranges for which LEDs have not been reported. Additionally, high-brightness mid-infrared LEDs based upon antimonide-arsenide heterostructures have not been reported.

Together, the technologies for mechanical packaging, thermal management, electrical control, and optical guiding provide a broad technology base for high-brightness LEDs. This technology base accommodates the semiconductor materials and properties employed for LEDs operating at near-infrared, visible, and ultraviolet wavelengths. However, there are not corresponding mid-infrared high-brightness LEDs, which might take advantage of this technology base, and there are not corresponding mid-infrared high-brightness LEDs with their own supporting specialized industrial technology base. Accordingly, there are a number of improvements that can be made within the art.

BRIEF SUMMARY

Embodiments of the present invention comprise systems, methods, and apparatus configured to generate mid-infrared LEDs. In particular, embodiments of the present invention comprise mid-infrared high-brightness LEDs that are configured to take advantage of one or more existing support technologies. Additionally, embodiments of the present invention provide unique and novel configurations for LED devices.

Embodiments of the present invention can comprise a device emitting mid-infrared light that comprises a semiconductor substrate of gallium antimonide ("GaSb") or closely related material. The device can also comprise epitaxial heterostructures of indium arsenide ("InAs"), gallium arsenide ("GaAs"), Aluminium Antimonide ("AlSb"), and related alloys forming light emitting structures cascaded by tunnel junctions. Further, the device can comprise light emission from the front, epitaxial side of the substrate.

Additional embodiments of the present invention can comprise a mid-infrared light emitting diode (LED) fabricated from antimonide-arsenide semiconductor heterostructures and configured into a front-side emitting high-brightness LED die. The device can further comprise optical power conversion superlattices comprised of cascaded double heterostructure confinement light emission stages with superlattice electron and hole injectors.

Additional features and advantages of exemplary embodiments of the invention will be set forth in the description which follows, and in part will be obvious from the description, or may be learned by the practice of such exemplary embodiments. The features and advantages of such embodiments may be realized and obtained by means of the instruments and combinations particularly pointed out in the appended claims. These and other features will become more fully apparent from the following description and appended claims, or may be learned by the practice of such exemplary embodiments as set forth hereinafter.

BRIEF DESCRIPTION OF THE DRAWINGS

In order to describe the manner in which the above recited and other advantages and features of the invention can be obtained, a more particular description of the invention briefly described above will be rendered by reference to specific embodiments thereof, which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION

Figure 1:
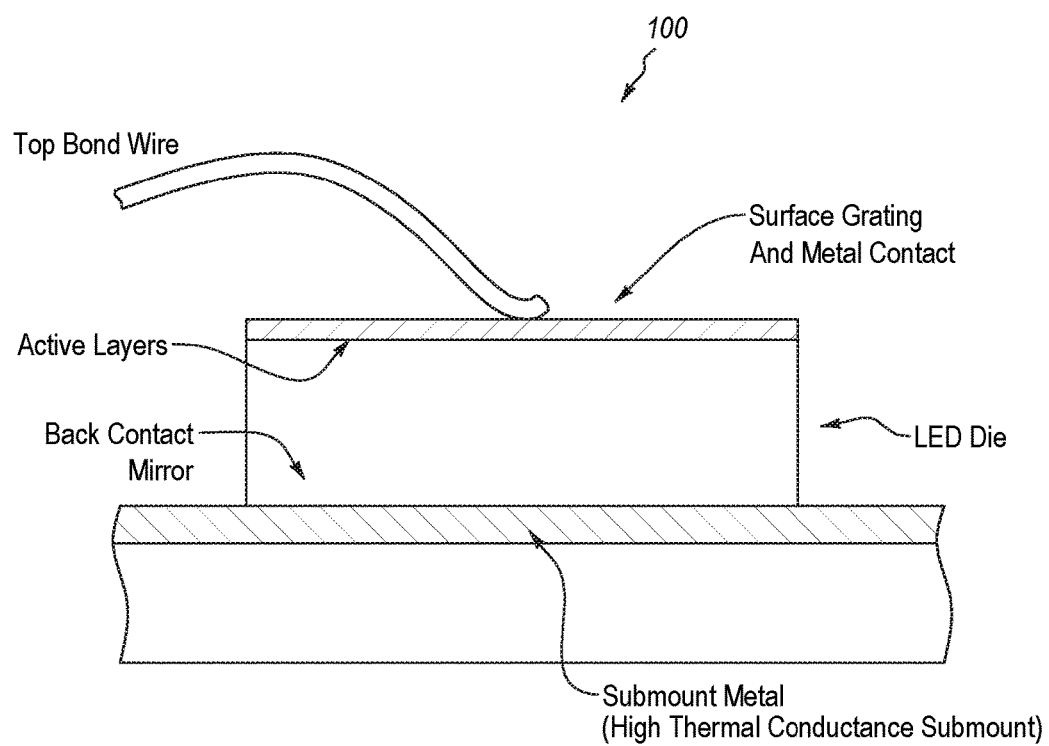
FIG. 1 illustrates a cross-sectional view of an LED in accordance with embodiments of the present invention.

The present invention extends to systems, methods, and apparatus configured to generate mid-infrared LEDs. In particular, embodiments of the present invention comprise mid-infrared high-brightness LEDs that are configured to take advantage of one or more existing support technologies. Additionally, embodiments of the present invention provide unique and novel configurations for LED devices.

The embodiments disclosed herein of the present mid-infrared LEDs include devices with wavelengths that range from about 3 to 20 µm. In at least one embodiment of the present invention, particular wavelengths of light can be obtained by making specific adjustments to the antimonide-arsenide semiconductor heterostructure layer thicknesses and by making specific adjustments to the sizes of the light-extraction buttes on the surface and to the thicknesses of the anti-reflection coating. In at least one embodiment, the mechanical, electrical, optical, and packaging features and structures can comprise the same forms for different antimonide-arsenide mid-infrared LEDs operating at different wavelengths.

Mid-infrared high-brightness LEDs may find widespread use in many applications. The broad range of desirable new applications and uses enabled by high-brightness mid-infrared LEDs, as well as other new format LEDs, based upon antimonide-arsenide semiconductor heterostructures may include mid-infrared image illumination, spectroscopy, chemical sensing, and communication links. However, the semiconductor materials and heterostructures developed and produced for visible, ultraviolet, and near-infrared light emission cannot be used for conventional mid-infrared emission.

At least one embodiment disclosed herein is related to implementing a new class of mid-infrared LEDs that meet the needs for operation at several different wavelengths for a variety purposes. The embodiment may comprise implementing mid-infrared LEDs in a high-brightness LED format through the use of antimonide-arsenide semiconductor heterostructures.

Conventional high-brightness LED device die formats developed for other semiconductor material heterostructures operating at shorter wavelengths benefit greatly from a supporting technology base that includes mechanical packaging for the die, control electronics for operating the devices, thermal management elements to dissipate heat, and light extraction structures particular to those shorter wavelength devices. Conventional arsenide-antimonide LED devices are not compatible with the existing high-brightness LED technology base. Embodiments of the present invention enable a new class of antimonide-arsenide semiconductor based mid-infrared LED devices that can accommodate a high-brightness format that can be compatible with existing packaging, electrical drive, thermal management, and optical engineering technologies for high-brightness format LEDs developed for other wavelengths.

Within conventional antimonide-arsenide mid-infrared LEDs, several technical problems contribute to incompatibility with existing high-brightness format LED technology. For example, conventional antimonide-arsenide heterostructures have lower internal conversion efficiency of electrical to optical power because of Auger recombination and other loss mechanisms. This results in the problem of more heat power to be dissipated per optical power generated.

An additional technical problem with conventional antimonide-arsenide mid-infrared LEDs relates to the lower energy per photon at the longer wavelengths of the mid-infrared spectrum. This lower energy per photon creates the problem that larger current densities are needed for a given output power. Additionally, optical properties of the antimonide-arsenide semiconductor materials include greater internal light absorption at mid-infrared wavelengths by free charge carriers. This absorption allows less light to be available for output and causes more heat to dissipate. Further, the antimonide-arsenide materials have higher indices of refraction. The higher indices can create the problem of greater total internal reflection and more difficult light extraction.

Additionally, conventional LEDs operating in the mid-infrared range of the electromagnetic spectrum have narrower semiconductor energy bandgaps. This creates the problem of lower operating voltages across junctions that do not match voltages for existing high-brightness LED driving circuitry. The lower bandgaps at mid-infrared wavelengths can also create the problem that the spreading resistance across the surface from a simple metallic contact becomes relatively much more important, which can greatly reduce the device efficiency.

Accordingly, conventional uses of the antimonide-arsenide semiconductor materials require different combinations of metals and dielectric materials for fabricating LED die from the combinations of metal and dielectric materials used for high-brightness LEDs at shorter wavelengths based upon other semiconductor material systems. This presents the problems of developing new materials combinations for the antimonide-arsenide mid-infrared LEDs that are also compatible with the existing packaging and other technologies for high-brightness LEDs.

Embodiments disclosed herein provide device structure elements that together implement high-brightness format LEDs based on antimonide-arsenide semiconductor heterostructures for operation across the mid-infrared wavelength range. The principal high-brightness LED embodiments are front-side light emitting devices with the backside attached to an electrically and thermally conductive package surface.

Within embodiments of a front-sided high-brightness LED, electrical current flows into the devices from front side bonding wires into electrical contact structures. The current then flows through the light emitting epitaxial heterostructures, into the semiconductor substrate, and out through the backside electrical contact. Light extraction from the heterostructures through the front side is accomplished with surface and internal structures. Heat can also be dissipated through the backside surface.

Turning now to the figures, FIG. 1 depicts a cross-sectional view of a representative bonding and packaging configuration as described in more detail to follow. In at least one embodiment, the bonding and packaging configuration may be for a top-side emitting LED 100 for wavelengths $\lambda_o$ from about 3 to 15 μm. One will understand that the figures depicted and described herein are for explanation and clarity only and are not meant to limit the invention to any particular configuration or embodiment.

Figure 2B:
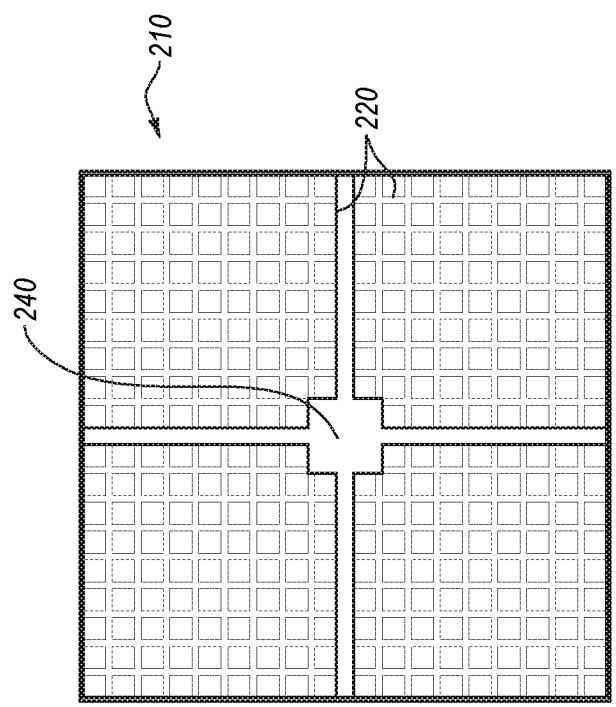
FIG. 2B illustrates a surface view of an LED in accordance with embodiments of the present invention.
Figure 2A:
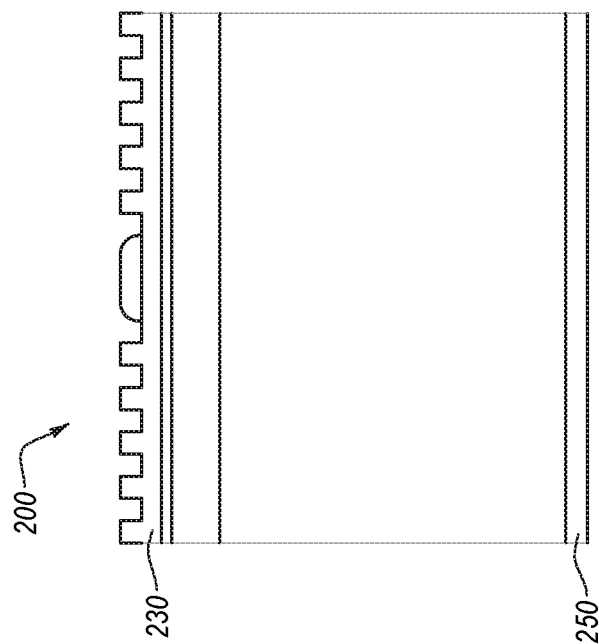
FIG. 2A illustrates a cross-sectional view of a die in accordance with embodiments of the present invention.

FIGS. 2A and 2B respectively depict a die cross-sectional diagram 200 and a top-surface layout 210 with etched dielectric butte output couplers 220. In at least one embodiment, the buttes 220 may be 2 μm wide, 1 μm high GaSb buttes etched in the contact metal mesh openings. The coupling buttes 220 can be etched into an epitaxial GaSb layer, stopping on an n-type InAs layer 230. The InAs layer 230 is contacted with a typical titanium ("Ti")/Platinum ("Pt")/Gold ("Au") ohmic metallization that also serves for the current spreading and wire-bonding layer. As shown in FIG. 2B, in at least one embodiment, the active emission layers and coupling buttes 210 cover the entire front surface, and the current spreading pattern mitigates in-plane potential drops across the device.

As depicted, the LED device 100 can comprise a central wire-bonding pad 240 to a top-side current-spreading metal pattern. The backside die metallization layers 250 can combine to serve as (i) the electrical contact to the n-GaSb substrate, (ii) a slightly irregular mirror to redirect light back to the top-surface buttes, and (iii) a component of the eutectic die-attach system. The same die may alternatively be attached with electrically and thermally conductive epoxy. Longer wavelengths may require thinned substrates to benefit from back-mirror reflections.

Figure 3:
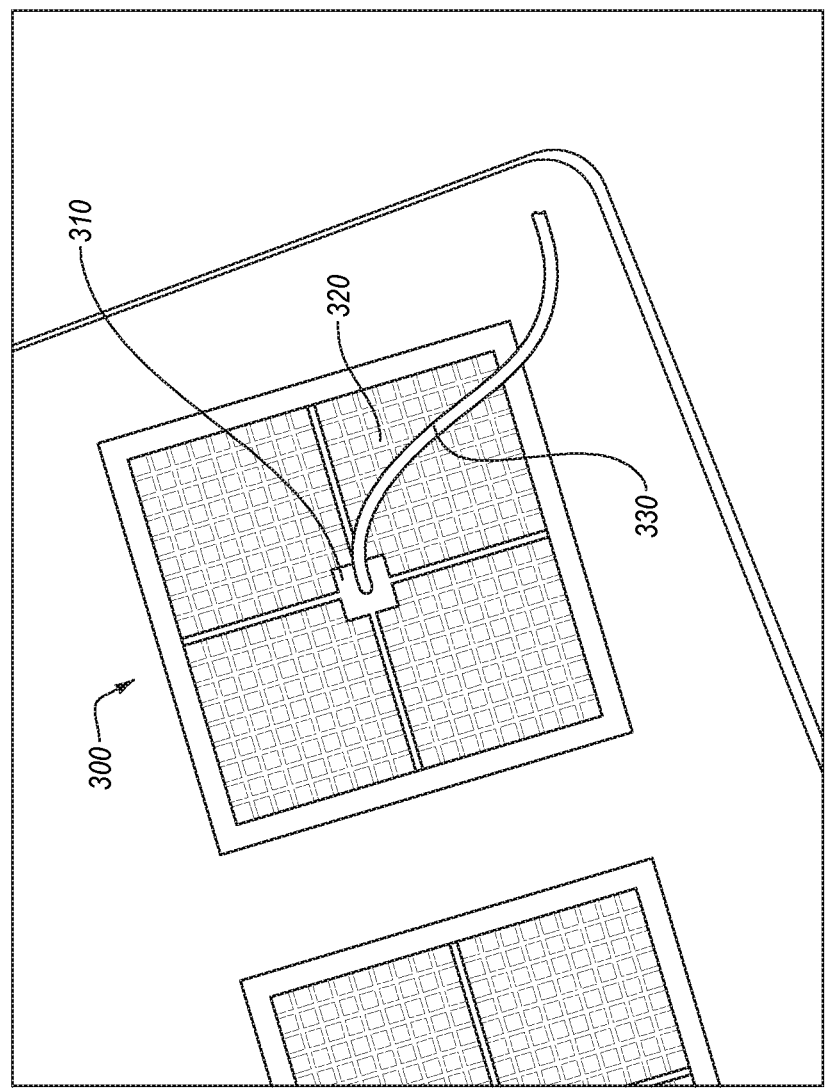
FIG. 3 illustrates a die bonding and packaging example for an LED in accordance with embodiments of the present invention.

FIG. 3 displays a depiction of a 1 mm square LED 300 which emits 4.25 μm wavelength light. The LED 300 is depicted as being attached to an LED package 310 with conducting epoxy and bonded with a single wire 320. A top bond wire 320 can make contact to the front-side bonding pad 330. In at least one embodiment, electrical current flows from the wire into the contact structures, through the active layers, which are the antimonide-arsenide heterostructures, through the GaSb substrate, and out from the LED die through the backside metal layers. The substrate may comprise a lightly-doped n-type GaSb wafer which has been thinned and polished to a thickness of approximately 50 μm.

Figure 4:
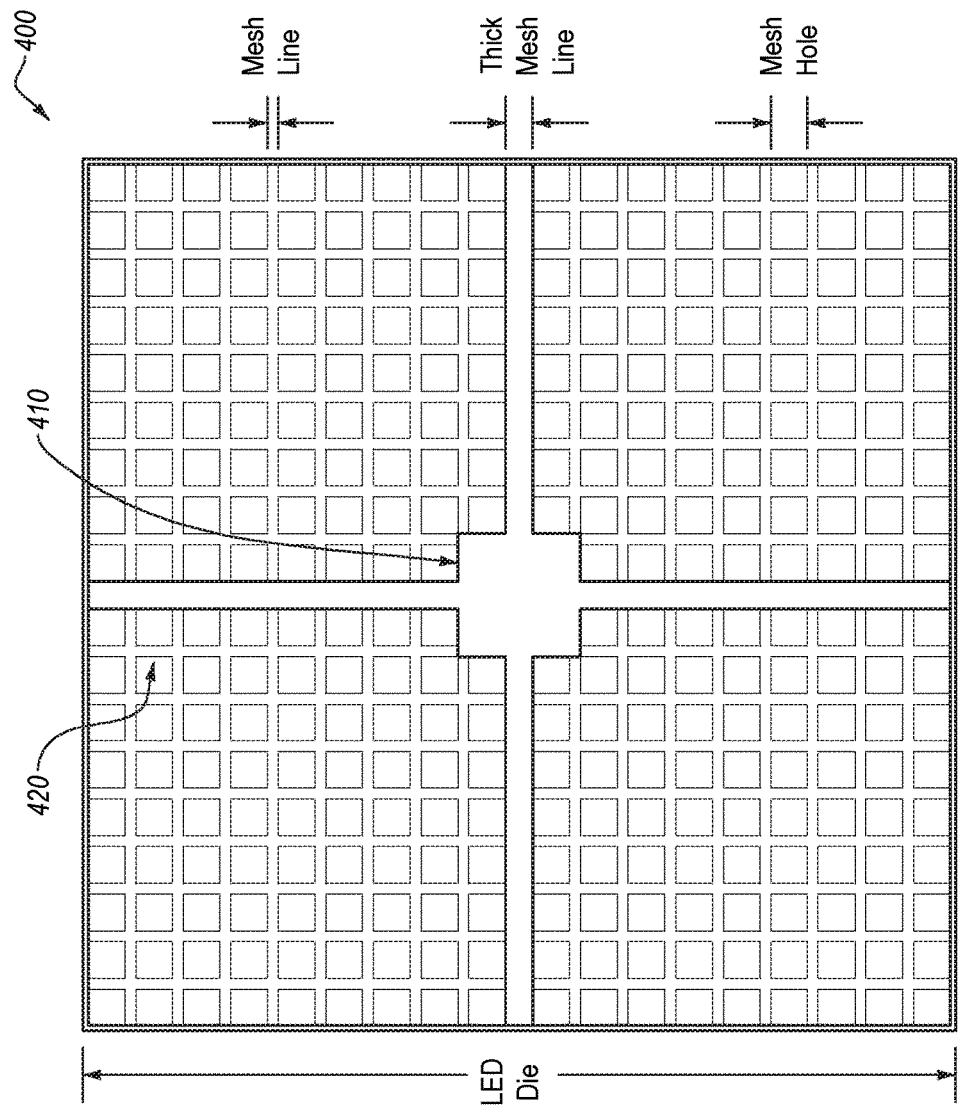
FIG. 4 illustrates a metal mesh semiconductor in accordance with embodiments of the present invention.

FIG. 4 depicts a diagram of a metal layer comprising the current spreading metal mesh 400 and the wire bonding pad 410 includes a thin Ti layer for adhesion to the n-type InAs layer, a thin Pt layer to block Au diffusion, and a thick Au layer for conducting electrical current. In at least one embodiment, the fine mesh lines 420 are approximately 5 μm wide and 1 μm thick, and the four thick mesh lines are approximately 20 μm wide. The mesh openings may be approximately 50 μm across.

Figure 5:
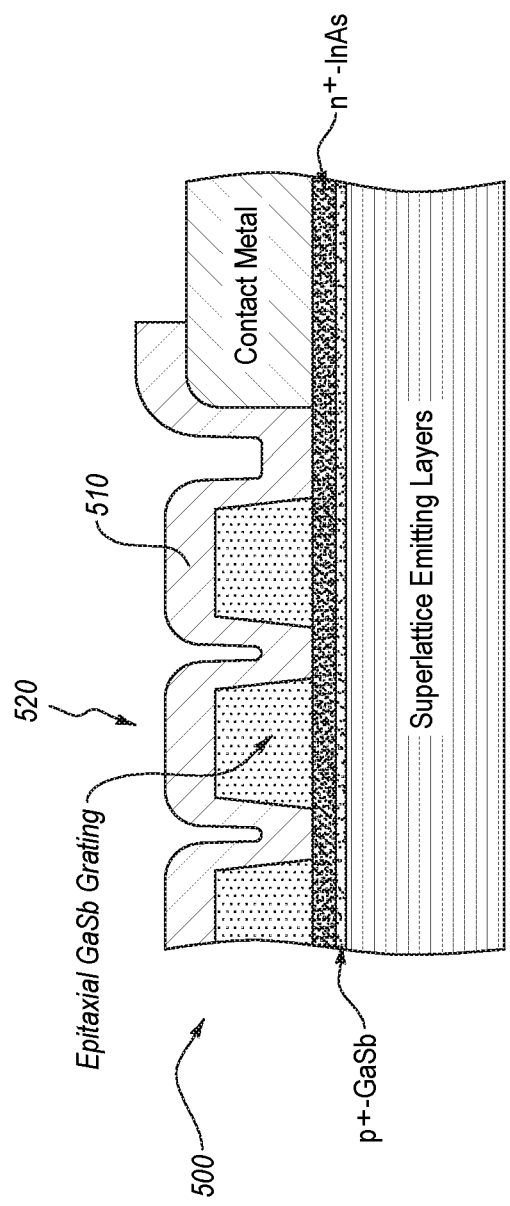
FIG. 5 illustrates a cross-sectional view of a top surface of an LED in accordance with embodiments of the present invention.

The diagram of FIG. 5 displays a cross sectional view of an embodiment of LED surface features 500 and includes the anti-reflection coating 510 applied to the surface for light extraction. The anti-reflection coating 510 can also serve as a surface passivation layer. An additional surface passivation coating can cover the etched sidewalls of a butte surface feature 520 etched through the active layers to confine the current and prevent side-wall current leakage.

Figure 6:
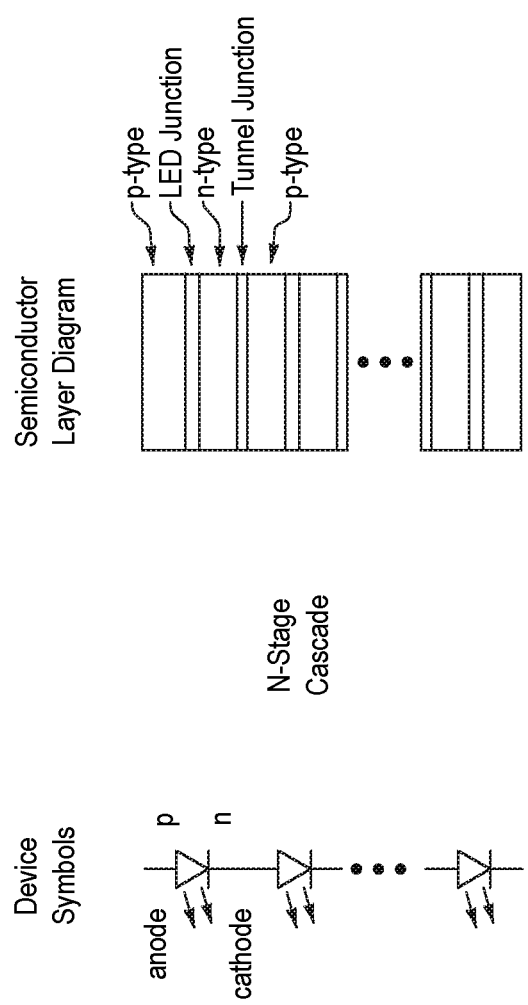
FIG. 6A illustrates a circuit diagram of an LED in accordance with embodiments of the present invention.
FIG. 6B illustrates a cross-sectional view of an LED in accordance with embodiments of the present invention.
Figure 7:
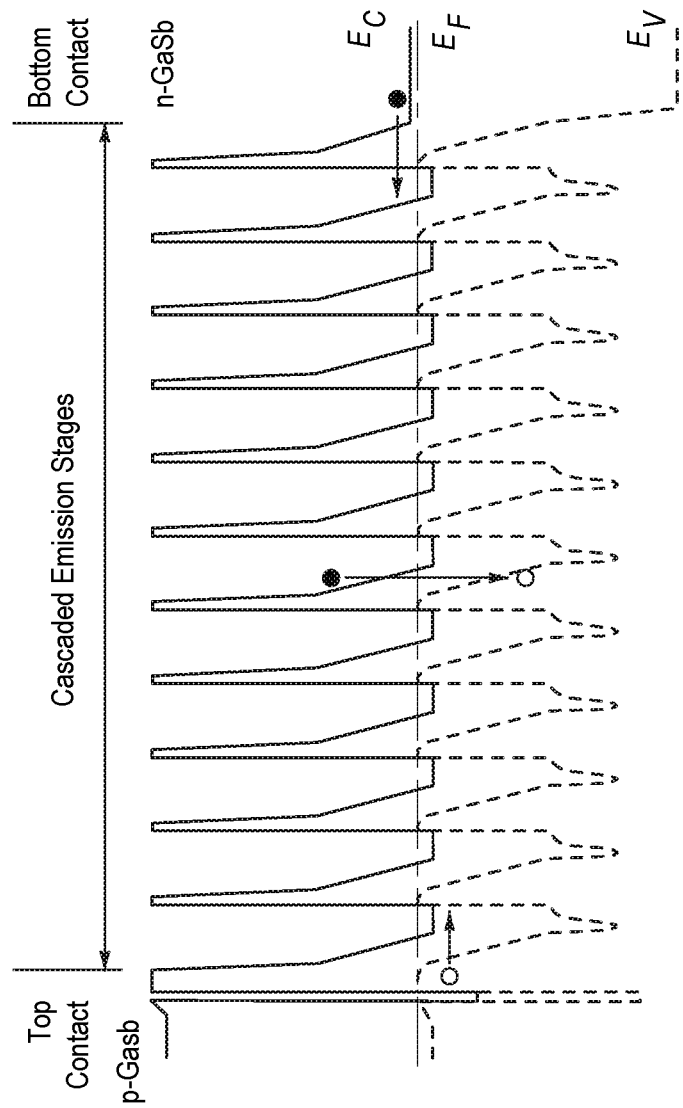
FIG. 7 illustrates a diagram of light emission stages in accordance with embodiments of the present invention.

The diagrams depicted by FIGS. 6A and 6B illustrate the circuit model and the cascaded emission stages in the N=12 stage 4.25 μm wavelength LED. The band diagram of FIG. 7 displays the effective conduction band and valence edges of the cascaded heterostructures as functions of position through the InAs and GaSb layers from the surface to the substrate. The band diagram also shows the GaSb top layer used for the light extraction buttes, the current spreading n-InAs layer in tunneling contact with the topmost hole injector, the twelve cascaded superlattice emission stages, and the bottommost electron injector in contact with the n-GaSb substrate.

Figure 8:
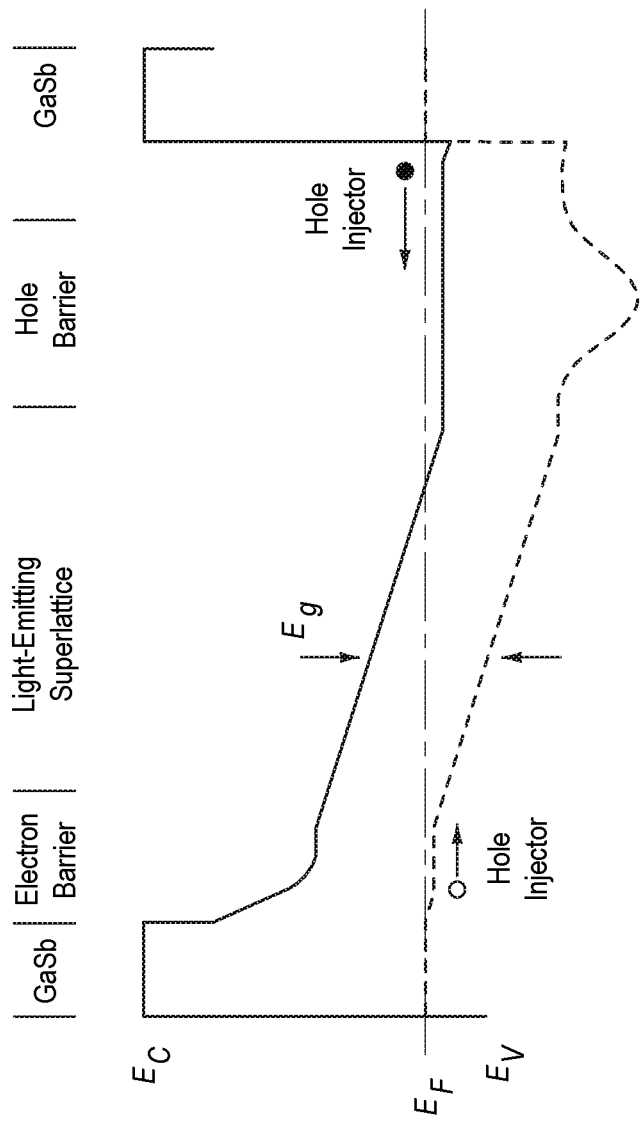
FIG. 8 illustrates another diagram of light emission stages in accordance with embodiments of the present invention.

The band diagram of FIG. 8 depicts the effective conduction band and valence edges of a single emission stage as functions of position. The emission stage can comprise a bandgap-graded hole injector from p-GaSb, which injects holes into the light emitting superlattice and which also serves as an electron barrier. The light emission superlattice for the 4.25 μm wavelength LED may comprise 6.5 monolayer InAs layers and 7.0 monolayer GaSb layers, with a total thickness of 98 nm. The lower bandgap-graded electron injector and hole barrier connecting the cascading tunnel junction may be comprised of a variable-period superlattice.

Several device structure elements combine and contribute to more than one of the properties that enable the mid-infrared LED device packaging, electrical operation, optical light extraction, and heat dissipation. The overall LED device structure can be adapted with specific adjustments to the device structure elements to produce devices suitable for emission wavelengths from about 3 to 20 μm. Other combinations of the various elements that combine for a high-brightness mid-infrared LED format are also useful for and enable other mid-infrared LED device formats.

Embodiments of LED device structure elements disclosed herein include cascaded antimonide-arsenide light emission stages. These elements can combine to convert electrical power to optical power, determine the LED emission wavelength, and determine the LED operation voltage. Additionally, the emission stages can have double heterostructure confinement configurations comprised of multiple epitaxial layers of InAs, GaSb, AlSb, and related alloys. Together, these configurations can form the charge injectors and confinement barriers of the double heterostructure configuration.

In various embodiments, the light emission structures within each stage are either superlattices or quantum wells. Cascading can be accomplished with tunnel junctions formed by heterostructures junctions between n-type InAs and p-type GaSb, or closely related structures. Multiple epitaxial layers of InAs, GaSb, AlSb, and related alloys also can form the internal electrical contacts between the emission stages and the cascading tunneling junctions and between the emission stages and the surface metal contacts.

Other embodiments of LED device structure elements disclosed herein include patterned epitaxial surface features, an anti-reflection coating, a thinned n-type GaSb substrate, and a reflective backside metal coating. These elements can combine to efficiently extract the light generated from the emission stages.

In at least one embodiment, the front side surface light extraction features are comprised of weakly-coupled wavelength-scale buttes 220 (FIG. 2) etched into a surface bulk layer of semiconductor such as GaSb and coated with an anti-reflection coating matched to the LED emission wavelength. The wavelength-dependence of the surface features for different wavelength LEDs can be adjusted by the lithographic size of the features and the height of the buttes 220. The butte feature height can be established by epitaxial growth of, for example, GaSb on top of an InAs etch-stop layer, which also serves as an ohmic electrical contact layer as part of the metal-mesh semiconductor electrical contact.

A designer can thin the substrate by removing most of the original GaSb substrate by lapping and polishing the backside. The backside surface of the thinned substrate can be made irregular and shiny from the thinning and polishing to approximate a diffusively reflective mirror. In at least one embodiment, the reflective backside metal structure is comprised of the multiple metal layer sequence that can include palladium ("Pd"), Ti, Pt, Au, and nickel ("N") i layers, which also provide for a backside electrical contact and for an Au:Sn ("gold:tin") eutectic bond to the device package.

These various device structure elements work together to accomplish light extraction by transmitting the initially generated light traveling upwards within the escape cones of the antireflection coated buttes out of the device die. Upward-directed light which does not escape on the first pass is reflected downwards to join the other downward traveling light, and the reflection from the patterned front side features scatters some of the light into the escape cones. The backside internal mirror reflects light back upwards for further extraction. The irregular shiny surface of the backside mirror can further scatter some light back into the light cone. The thinned substrate can also reduce absorption and loss from free carriers of the light that travels down to the back mirror and back to the front surface.

Other embodiments of LED device structure elements disclosed herein can include front side metal wire bonding pads, a composite metal-mesh semiconductor current spreading ohmic contact, a side-wall heterostructure passivation layer, and an ohmic contact structure to the n-GaSb substrate. These elements can combine to efficiently inject electrical current into the cascaded light emission stages.

In at least one embodiment, the wire-bonding pad is formed lithographically as part of composite mesh electrical contact. The composite metal-mesh top contact metal layers include an adhesion layer of Ti, a gold diffusion barrier of Pt, and a current-carrying and wire-bonding Au layer. The layers can be deposited on the semiconductor contact layer of n-nAs to form an ohmic contact.

The thickness and average surface coverage of the metal mesh can be chosen to reduce the average spreading resistance across the top surface to below the injection resistance of the cascaded light emission heterostructure layer and ensure uniform current spreading across the die. The size of the mesh opening and the conductivity of the semiconductor contact layer can be chosen to ensure uniform current spreading within a mesh opening.

In at least one embodiment, a deposited surface passivation layer on the sidewalls of etched or otherwise exposed emission heterostructure edges reduces parasitic electrical leakage currents on the outside edges of the heterostructures. The backside metal structure can include a Pd layer for an ohmic contact to n-GaSb. The backside metal structure can also include layers of Ti, Pt, Au, and Ni, which provide for a backside internal mirror and for an Au:Sn eutectic bond to the device package.

As such, electric current introduced into the metal-mesh composite contact from the bonding wire can spread uniformly across the device top surface. The electric current can also be injected into the cascaded heterostructure light emission layers. The large area backside contact area may ensure a sufficiently small total contact resistance despite the relatively large specific contact resistance typical for n-GaSb.

Further embodiments of LED device structure elements disclosed herein can comprise a thinned GaSb substrate and a backside metal coating suitable for a eutectic die attach. These elements can combine to effectively remove unwanted heat generated in the cascaded light emission stages.

In at least one embodiment, a designer can thin the substrate by removing most of the original GaSb substrate through lapping and polishing the backside. The backside metal structure can include a Ni barrier layer underneath an outer Au layer that contributes to an Au:Sn eutectic die attach bond. The backside metals can also include layers of Pd, Ti, Pt, Au, which provide for a backside internal mirror and for an ohmic contact to the n-GaSb LED substrate. In at least one embodiment, the backside metal layers are also suitable for a conductive epoxy die attach configuration. Accordingly, in at least one embodiment, heat generated in the light emitting cascaded heterostructures flows through the thinned substrate, out through the backside metal layers, and into the thermally conductive heat dissipating device package.

Embodiments of the present invention provide for a new class of mid-infrared LEDs with wavelengths from about 3 to 20 μm, based on cascaded antimonide-arsenide light-emitting heterostructures. Additionally, the embodiments can facilitate the ability to make specific changes in some heterostructure layer thicknesses and specific adjustments to light extraction surface feature sizes to give mid-infrared LED devices of different wavelengths.

In at least one embodiment, a designer can adjust an LED device configuration to allow for accommodating changes in the balance of device loss mechanisms, such as free-carrier absorption and Auger recombination, with the changing wavelengths. Additionally, at least one embodiment adapts the properties of antimonide-arsenide heterostructures to the requirements for compatibility with the more general high-brightness LED technology. Further, some of the embodiments provide for mid-infrared LED die which are compatible with other high-brightness LED packaging.

Additionally, some of the embodiments provide for mid-infrared LED dies that are compatible with the electrical drive and control circuitry and systems employed for other high-brightness LEDs. Similarly, at least one of the embodiments provide for mid-infrared LED die that is compatible with the heat management dissipation and systems employed for other high-brightness LEDs. Several of the embodiments also combine to provide for other mid-infrared LED device formats, such as lower power devices or higher modulation frequency devices.

Accordingly, the new class of mid-infrared LED devices, including the high-brightness formats and other formats, can enable several new uses, including, but not limited to, those to be described herein. For example, mid-infrared LEDs operating at various wavelengths may be useful for detecting chemical and biological substances and concentrations (e.g., carbon dioxide). Additionally, mid-infrared LEDs configured for high modulation frequencies may be useful for new communication links in this range of the electromagnetic spectrum. Further, high-brightness mid-infrared LEDs can also function as a new class of illuminators for night vision and thermal imaging sensors and cameras operating in the mid-infrared portion of the electromagnetic spectrum.

What is claimed is:

1. A light-emitting diode die emitting mid-infrared light, the light-emitting diode die comprising:
    a semiconductor substrate of GaSb;
    epitaxial heterostructures located on the semiconductor substrate and forming an epitaxial side of the substrate, wherein the epitaxial heterostructures form light emitting structures cascaded by tunnel junctions;
    wherein the epitaxial side of the substrate is configured to emit light formed by the epitaxial hetero structures; and
    a metal mesh structure in contact with an n-type InAs layer to form a low-resistance ohmic contact, the mesh structure comprising:
        a first portion comprising a first set of four or more metal mesh lines directly above and directly contacting the n-type InAs layer, the first set of four or more metal mesh lines having a first size;
        a second portion comprising a second set of four metal mesh lines, wherein each one of the second set of four metal mesh lines extends directly away from a common point, the second set of four metal mesh lines having a second size larger than the first size, wherein the first portion is between the InAs layer and the second portion, wherein each of the first set of four or more metal mesh lines have a smaller thickness than each of the second set of four metal mesh lines, wherein the first portion comprises mesh openings in the metal mesh structure, and
        wherein the metal mesh structure is configured to spread current evenly across the light-emitting diode die while allowing light extraction.

2. The light-emitting diode die as recited in claim 1, wherein the epitaxial heterostructures comprises at least one of InAs, GaAs, and AlSb.

3. The light-emitting diode die as recited in claim 1, further comprising internal superlattice heterostructure barriers and electrical contacting structures comprising layers of InAs, GaAs, and AlSb.

4. The light-emitting diode die as recited in claim 3, wherein the internal superlattice heterostructure barriers and electrical contacting structures are configured to provide one or more of the following:
    double-heterostructure carrier confinement to the light emitting layers,
    electrical contacts between light emitting layers and cascading tunneling junctions,
    electrical contacts between the light emitting layers and external contact structures, and
    electrical contacts between external contact structures and the cascading tunneling junctions.

5. The light-emitting diode die as recited in claim 1, further comprising superlattice light emission structures.

6. The light-emitting diode die as recited in claim 1, further comprising quantum well light emission structures.

7. The light-emitting diode die as recited in claim 1, wherein:
    the second set of four metal mesh lines comprise a width of 20 µm;
    the first set of four or more metal mesh lines comprise a width of 5 µm and a thickness of 1 µm; and
    the mesh openings comprise openings of 50 µm across.

8. The light-emitting diode die as recited in claim 1, wherein the light-emitting diode die comprises a substrate that is configured to reduce optical absorption and improve thermal conduction away from the epitaxial layers.

9. The light-emitting diode die as recited in claim 1, wherein the light-emitting diode die comprises a low infrared light absorption n-type GaSb substrate.

10. The light-emitting diode die as recited in claim 1, wherein the light-emitting diode die comprises a substrate with a backside surface roughened, polished, and coated with metal to approximate a Lambertian reflector for improved light extraction.

11. The light-emitting diode die as recited in claim 1, wherein the light-emitting diode die is comprises a substrate with a backside surface coated with metal layers, which include Pd, Ti, Pt, Au, and Ni.

12. The light-emitting diode die as recited in claim 11, wherein the light-emitting diode die is further configured to:
    provide a reflector for internal reflections and improved front side light extraction,
    form a low-resistance ohmic contact to the n-GaSb,
    provide for an Au:Sn eutectic die attach bond, and
    provide for a conducting epoxy die attach bond.

13. The light-emitting diode die as recited in claim 1, wherein the light-emitting diode die comprises lithographic front side features for improved light extraction, wherein the lithographic front side features:
    are etched into an epitaxial GaSb grown on top of an InAs electrical contact layer, are coated with an antireflection layer,
    provide for improved light extraction from emitting superlattices or quantum wells, and
    provide for an internal backscattering pattern that improves light extraction on subsequent incidence on front side features after reflection from a backside reflector.

14. The light-emitting diode die as recited in claim 1, wherein the light-emitting diode die is attached and wire bonded to a standard transistor-outline semiconductor device package, with the die attachment accomplished by either an Au:Sn based eutectic bond or a thermally and electrically conductive epoxy bond.

15. The light-emitting diode die as recited in claim 1, wherein the light-emitting diode die is attached and wire bonded to a standard high-brightness LED device package, with the die attachment accomplished by either an Au:Sn based eutectic bond or a thermally and electrically conductive epoxy bond.

16. The light-emitting diode die as recited in claim 1, wherein the light-emitting diode die is employed as a light source in a spectroscopy system for detecting chemical or biological or inorganic substances in gaseous, liquid, or solid matrices.

17. The light-emitting diode die as recited in claim 1, wherein the light-emitting diode die is employed as a light source in a communication system for transmitting digital or analog data signals.

18. The light-emitting diode die as recited in claim 1, wherein the light-emitting diode die is employed as a light source in an illuminator device for illuminating a scene for imaging with an infrared camera or light detector.

19. A light-emitting diode die emitting mid-infrared light, the light-emitting diode die comprising:
 a semiconductor substrate of GaSb;
 epitaxial heterostructures located on the semiconductor substrate and forming an epitaxial side of the substrate, wherein the epitaxial heterostructures form light emitting structures cascaded by tunnel junctions;
 wherein the epitaxial side of the substrate is configured to emit light formed by the epitaxial heterostructures; and
 a metal mesh structure in contact with an n-type InAs layer to form a low-resistance ohmic contact, the mesh structure comprising:
  a first portion comprising a first set of eight or more metal mesh lines directly above and directly contacting the n-type InAs layer;
  a second portion comprising a second set of four metal mesh lines, wherein each one of the second set of four metal mesh lines extends directly away from a common point, wherein the first portion is between the InAs layer and the second portion, wherein each of the first set of eight or more metal mesh lines have a smaller thickness than each of the second set of four metal mesh lines, wherein the first portion comprises mesh openings in the metal mesh structure, and
 wherein the metal mesh structure is configured to spread current evenly across the light-emitting diode die while allowing light extraction.

20. A light-emitting diode die emitting mid-infrared light, the light-emitting diode die comprising:
 a semiconductor substrate of GaSb;
 epitaxial heterostructures located on the semiconductor substrate and forming an epitaxial side of the substrate, wherein the epitaxial heterostructures form light emitting structures cascaded by tunnel junctions;
 wherein the epitaxial side of the substrate is configured to emit light formed by the epitaxial heterostructures; and
 a metal mesh structure in contact with an n-type InAs layer to form a low-resistance ohmic contact, the mesh structure comprising: a first portion comprising a first set of eight or more metal mesh lines directly above and directly contacting the n-type InAs layer;
  a second portion comprising a second set of four metal mesh lines, wherein each one of the second set of four metal mesh lines extends directly away from a common point, wherein the first portion is between the InAs layer and the second portion, wherein each of the first set of eight or more metal mesh lines have a smaller thickness than each of the second set of four metal mesh lines, wherein the first portion comprises mesh openings in the metal mesh structure, the second set of four or more metal mesh lines comprise a width of 20 µm, the first set of eight or more metal mesh lines comprise a width of 5 µm and a thickness of 1 µm, and the mesh openings comprise openings of 50 µm across, and
 wherein the metal mesh structure is configured to spread current evenly across the light-emitting diode die while allowing light extraction.

21. The light-emitting diode die of claim 1, wherein at least two of the second set of four metal mesh lines is directly connected to the common point.

22. The light-emitting diode die of claim 1, wherein a first subset of two of the second set of four metal mesh lines is connected to a second subset of two of the second set of four metal mesh lines.

23. The light-emitting diode die of claim 1, wherein a first subset of two of the second set of four metal mesh lines is directly connected to a second subset of two of the second set of four metal mesh lines.

24. The light-emitting diode die of claim 1, wherein the common point is a contact structure.

25. The light-emitting diode die of claim 24, wherein the contact structure is located on a front side of the light-emitting diode die.

* * * * *